US006956739B2

(12) United States Patent
Bunyan

(10) Patent No.: US 6,956,739 B2
(45) Date of Patent: Oct. 18, 2005

(54) HIGH TEMPERATURE STABLE THERMAL INTERFACE MATERIAL

(75) Inventor: Michael H. Bunyan, Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/431,392

(22) Filed: May 7, 2003

(65) Prior Publication Data

US 2004/0081843 A1 Apr. 29, 2004

Related U.S. Application Data

(60) Provisional application No. 60/422,194, filed on Oct. 29, 2002.

(51) Int. Cl.[7] ................................................. H05K 7/20
(52) U.S. Cl. ....................... 361/700; 361/704; 361/713; 361/714; 428/348; 428/515; 428/523; 524/399; 524/400; 524/404
(58) Field of Search .............................. 428/40.5, 41.3, 428/41.8, 220, 348, 515; 361/700, 713, 704, 714; 524/399, 400, 404; 525/220, 240

(56) References Cited

U.S. PATENT DOCUMENTS

| 2,311,526 A | 2/1943 | Ferguson et al. |
| 3,332,055 A | 7/1967 | Bogner |
| 3,609,104 A | 9/1971 | Ehrreich et al. |
| 3,928,907 A | 12/1975 | Chisholm |
| 4,031,169 A | 6/1977 | Morris |
| 4,299,715 A | 11/1981 | Whitfield et al. |
| 4,384,610 A | 5/1983 | Cook et al. |
| 4,389,340 A | 6/1983 | Levy |

(Continued)

OTHER PUBLICATIONS

IBM Technical Disclosure Bulletin, vol. 25, No. 11A Apr. 1983 Flexible Heat–Conducting Sheet Material For Semi-conductor Packages, R. H. Lacombe and H. Lee.
IBM Technical Disclosure Bulletin, vol. 24, No. 12 May 1982 Chip Cooling Employing Alloys Having Different Solidus Temperatures, J. K. Kassan, S. Oktay and J. Paivanas.
IBM Technical Disclosure Bulletin, vol. 27, No. 7A Dec. 1984 Cooling Assembly For Solder–Bonded Semiconductor Devices—J. L. Horvath.
IBM Technical Disclosure Bulletin, vol. 35, No. 7 Dec. 1992 Thermally Conductive, Reworkable, Elastomeric Interposer For Chip–to–Heat Sink Attachment.
ORCUS inc. THERMAPHASE—Thermal Interface Materials for Electronics: Unique Characteristics, Lowest Thermal Resistance.
Technical Bulletin #77 Chomerics—CHO–THERM Thermal Interface Materials 1997.
Technical Bulletin #78 Chomerics—CHO–THERM Thermal Interface Materials 1998.
*Packaging Ideas*, Edited by Howard Markstein, Interface Materials Offer Heat Transfer and Isolation.

(Continued)

*Primary Examiner*—D. Lawrence Tarazano
(74) *Attorney, Agent, or Firm*—John A. Molnar, Jr.

(57) ABSTRACT

A thermally-conductive interface interposable intermediate a first heat transfer surface and an opposing second heat transfer surface to provide a thermal pathway therebetween. The interface includes a thermally-conductive compound formed into a layer which is conformable between the first and second heat transfer surface. The compound is an admixture of: (a) a liquid resin constituent; and (b) a particulate filler constituent. The liquid resin constituent may be an ethylene-propylene copolymer (EPM) or a terpolymer (EPDM) of ethylene and propylene and a diene which may be ethylidene norbornene (ENB) or dicyclopentadiene (DCPD).

52 Claims, 2 Drawing Sheets

U.S. PATENT DOCUMENTS

| | | |
|---|---|---|
| 4,466,483 A | 8/1984 | Whitfield et al. |
| 4,473,113 A | 9/1984 | Whitfield et al. |
| 4,487,856 A * | 12/1984 | Anderson et al. ........... 523/205 |
| 4,533,685 A | 8/1985 | Hudgin et al. |
| 4,546,411 A | 10/1985 | Kaufman |
| 4,561,011 A | 12/1985 | Kohara et al. |
| 4,575,432 A | 3/1986 | Lin et al. |
| 4,602,678 A | 7/1986 | Fick |
| 4,654,754 A | 3/1987 | Daszkowski |
| 4,685,987 A | 8/1987 | Fick |
| 4,722,960 A | 2/1988 | Dunn et al. |
| 4,755,249 A | 7/1988 | DeGree et al. |
| 4,764,845 A | 8/1988 | Artus |
| 4,782,893 A | 11/1988 | Thomas |
| 4,842,911 A | 6/1989 | Fick |
| 4,855,002 A | 8/1989 | Dunn et al. |
| 4,869,954 A | 9/1989 | Squitieri |
| 4,915,167 A | 4/1990 | Altoz |
| 4,965,699 A | 10/1990 | Jorden et al. |
| 4,974,119 A | 11/1990 | Martin |
| 4,979,074 A | 12/1990 | Morley et al. |
| 5,052,481 A | 10/1991 | Horvath et al. |
| 5,060,114 A | 10/1991 | Feinberg et al. |
| 5,061,549 A | 10/1991 | Shores |
| 5,137,959 A | 8/1992 | Block et al. |
| 5,167,851 A | 12/1992 | Jamison et al. |
| 5,194,480 A | 3/1993 | Block et al. |
| 5,213,868 A | 5/1993 | Liberty et al. |
| 5,250,209 A | 10/1993 | Jamison et al. |
| 5,298,791 A | 3/1994 | Liberty et al. |
| 5,302,344 A | 4/1994 | Perlman |
| 5,321,882 A | 6/1994 | Zaroui et al. |
| 5,352,731 A | 10/1994 | Nakano et al. |
| 5,372,883 A | 12/1994 | Shores |
| 5,471,027 A | 11/1995 | Call et al. |
| 5,533,256 A | 7/1996 | Call et al. |
| 5,545,473 A | 8/1996 | Ameen et al. |
| 5,602,221 A | 2/1997 | Bennett et al. |
| 5,679,457 A | 10/1997 | Bergerson |
| 5,770,318 A | 6/1998 | Friedman |
| 5,781,412 A | 7/1998 | de Sorgo |
| 5,796,582 A | 8/1998 | Katchmar |
| 5,798,171 A | 8/1998 | Olson |
| 5,930,893 A | 8/1999 | Eaton |
| 5,944,322 A | 8/1999 | Coff et al. |
| 6,197,859 B1 | 3/2001 | Green et al. |
| 6,372,997 B1 | 4/2002 | Hill et al. |
| 6,673,434 B2 * | 1/2004 | Nguyen ...................... 428/323 |
| 2002/0132896 A1 * | 9/2002 | Nguyen ...................... 524/404 |
| 2002/0179289 A1 * | 12/2002 | Yamashita et al. ..... 165/104.33 |
| 2003/0039825 A1 * | 2/2003 | Duvall et al. ............... 428/348 |
| 2003/0203188 A1 * | 10/2003 | Bunyan ...................... 428/328 |

OTHER PUBLICATIONS

Trilene®Liquid Polymers Selector Guide dated Jun., 2002.

Trilene®65 Trade Name Information Sheet. Applicants request the Examiner to consider this reference as being published more than one year before the earliest priority date of the subject application, however, Applicants respectfully reserve the right to supplement this Information Disclosure Statement and take a contrary position should it be necessary.

LMC DCPD—Dicyclopentatiene from LMC Technik. Applicants request the Examiner to comsider this reference as being published more than one year before the earliest priority date of the subject application, however, Applicants respectfully reserve the right to supplement this Information Disclosure Statement and take a contrary position should it be necessary.

Crompton Product Description for Trilene®65. Applicants request the Examiner to consider this reference as being published more than one year before the earliest priority date of the subject application, however, Applicants respectfully reserve the right to supplement this Information Disclosure Statement and take a contrary position should it be necessary.

Crompton Product Description for Trilene®67, 77 and CP80. Applicants request the Examiner to consider this reference as being published more than one year before the earliest priority date of the subject application, however, Applicants respectfully reserve the right to supplement this Information Disclosure Statement and take a contrary position should it be necessary.

Crompton Material Safety Data Sheet revised Feb. 8, 1999.

EARL'S Pressure Master—Engine Gaskets Sea is—1996 Earl's Performance Products.

* cited by examiner

HIGH TEMPERATURE STABLE THERMAL INTERFACE MATERIAL

CROSS-REFERENCE TO RELATED CASES

The present application claims the benefit of the filing date of U.S. Provisional Application Ser. No. 60/422,194; filed Oct. 29, 2002, the disclosure of which is expressly incorporated herein by reference.

BACKGROUND OF THE INVENTION

The present invention relates broadly to thermal management materials for electronic devices. Such materials commonly are used as interfaces for providing a low thermal impedance between, for example, the mating heat transfer surfaces of a heat-generating, electronic component, such as an integrated circuit (IC) chip, and a thermal dissipation member, such as a heat sink or spreader, for the conductive cooling of the electronic component. More particularly, the present invention relates to a thermally-conductive interface material which is formulated to be stable at higher operating temperatures of about 125° C. or more.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute a cured, sheet-like material in place of the silicone grease or wax. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics TEC Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase-change materials ("PCM") have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in commonly-assigned U.S. application Ser. Nos. 10/045,924, filed Jan. 14, 2002, entitled "Clean Release, Phase Change Thermal Interface," and 60/354,810, filed Feb. 6, 2002, entitled "Thermal Management Materials Having a Phase Change Dispersion," and in commonly-assigned U.S. Pat. No. 6,054,198, and are marketed commercially under the names THERMFLOW® T310, T443, T705, T710, T725, and A725 by the Chomerics TEC Division of Parker-Hannifin Corp., 16 Flagstone Drive, Hudson, N.H. 03051. Other phase-change materials are marketed commercially by the Bergquist Company (Minneapolis, Minn.) under the tradename "HI-FLOW™," by Thermagon, Inc. (Cleveland, Ohio) under the tradenames "T-PCM™" and by Orcus, Inc. (Stilwell, Kans.) under the tradename "THERMAPHASE." A phase-change material/metal foil laminate is marketed by Thermagon, Inc. under the tradename "T-MATE™."

For typical commercial application, the thermal interface material may be supplied in the form of a tape or sheet which includes an inner and outer release liner and an interlayer of thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which may be performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner is removed from the compound layer, and the pad positioned on the electronic component. A clamp may be used to secure the assembly in place.

In view of the foregoing, it will be appreciated that further improvements in thermal management materials would be well-received by electronics manufacturers. Especially desired would be thermal interface materials which offer phase-change-like thermal performance but which are able to withstand higher operating temperature for use in ever more demanding applications.

BROAD STATEMENT OF THE INVENTION

The present invention is directed to a thermally-conductive interface, and a material therefor, for a thermal management assembly involving, for example, a heat source such as an electronic chip or other heat-generating component and a thermal dissipation member such as a heat sink or spreader disposable in thermal adjacency with the electronic component for the conduction of heat therebetween. Particularly, the invention is directed to a material in the form of a thermally-conductive compound which is formable into a sheet, pad, or other layer which is highly compliant or otherwise conformable between the interfacing surfaces of the electronic component and the heat sink or spreader to provide a phase-change-like low thermal impedance across the assembly, and which in service is able to withstand operating temperatures of at least about 125° C. and, preferably, 165° C. or higher, without appreciable degradation in physical properties or thermal performance.

Heretofore, materials of the type herein involved, and particularly those of a phase change variety, conventionally were formulated as a blend of a resin or wax binder and a thermally-conductive, particulate filler which may be one or more metal powders or metal or non-metal nitrides or oxides. Such materials, although being highly conformable and affording excellent thermal performance, generally have not been specified for more demanding applications which require high temperature stability. It has been discovered, however, that an interface material formulated as blend or other admixture of a liquid polymer and a thermally-conductive filler can provide PCM-like performance while being able to withstand service temperatures of 125° and higher without appreciable degradation in physical properties or thermal performance.

In an illustrative embodiment, the thermal interface material of the present invention is formulated as a blend of a liquid resin constituent and one or more thermally-conductive, particulate fillers. The liquid resin constituent, which itself may be an admixture or blend, and which may be modified by blending with one or more other resins and/or one or more waxes, may be an ethylene-propylene copolymer (EPM) or a terpolymer (EPDM) of ethylene and propylene and a diene which may be ethylidene norbornene (ENB) or dicyclopentadiene (DCPD). Such Liquid EPM or EPDM may be viscous or viscoelastic at room temperature, but substantially less viscous or viscoelastic at elevated temperature so as to be highly conformable within the interface to afford PCM-like thermal performance. Preferably, the admixed material is formulated to be substantially form-stable at room temperature such that it may be formed into sheets or pads or otherwise for application or handling.

The present invention, accordingly, comprises the combination of elements and arrangement of parts and steps which are exemplified in the detailed disclosure to follow. Advantages of the present invention include a thermal interface material which is highly conformable for lowered contact resistance and PCM-like thermal performance, but which is able to withstand operating temperatures in excess of 125° C. and, preferably, 165° C. or more, so as to be adapted for use in high temperature applications. Further advantages include a thermal interface material which may be supplied in a sheet, tape, or pad, and which may be form-stable at room temperature for ease of handling and use. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

DETAILED DESCRIPTION OF THE INVENTION

Figure 1:
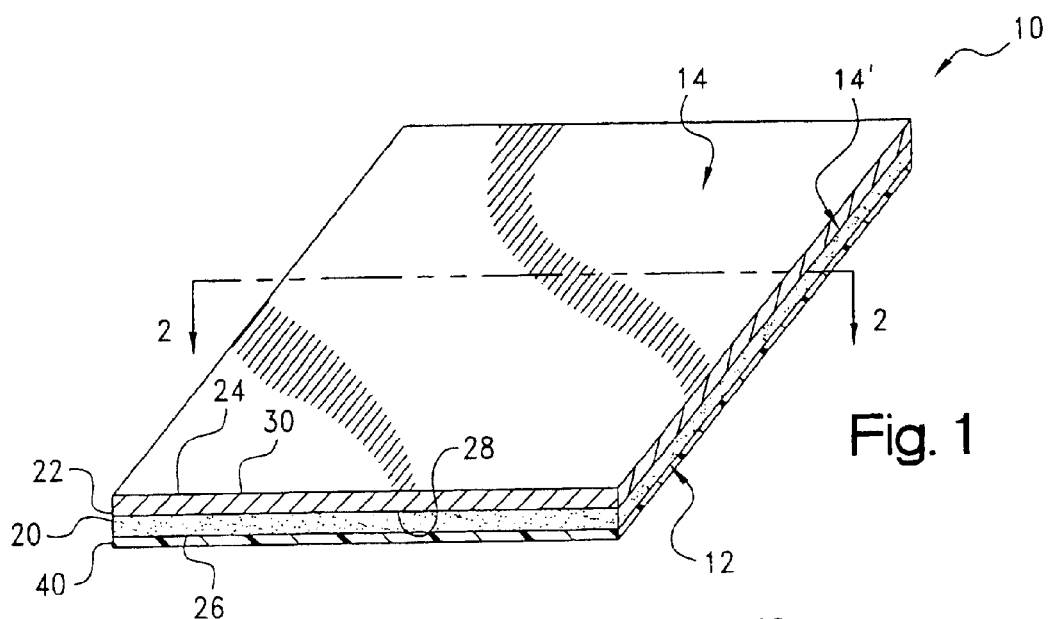
FIG. 1 is a perspective view of a representative thermal interface pad in accordance with the present invention.

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the thermally-conductive interface and material therefor of the invention herein involved is described in connection with its use within a thermal management assembly as a pad, which may be die or kiss-cut from a sheet or roll, which is adhered to a heat transfer surface of a thermal dissipation member such as a heat sink for heat transfer contact with a mating heat transfer surface of a electronic component. Such assemblies and thermal interface materials therefor are elsewhere described in U.S. Pat. Nos. 6,096,414; 6,054,198; 5,798, 171; 5,766,740; 5,679,457; 5,545,473; 5,533,256; 5,510, 174; 5,471,027; 5,359,768; 5,321,582; 5,309,320; 5,298, 791; 5,250,209; 5,213,868; 5,194,480; 5,137,959; 5,167, 851; 5,151,777; 5,060,114; 4,979,074; 4,974,119; 4,965, 699; 4,869,954; 4,842,911; 4,782,893; 4,764,845; 4,685, 987; 4,654,754; 4,606,962; 4,602,678; 4,473,113; 4,466, 483; 4,299,715; and 3,928,907. It will be appreciated, however, that aspects of the present invention, which alternatively may be provided in other roll, sheet, film, or layer form such as a tape, may find use in other thermal management applications. The material of the invention also may be liquid dispensed or otherwise applied in a layer or pattern onto one of the heat transfer surfaces by direct or indirect means such as spraying, knife, roller, drum or other coating, brushing, casting, dipping, extrusion, screen, transfer, or other printing, and the like. Such uses and applications therefore should be considered to be expressly within the scope of the present invention.

Figure 2:
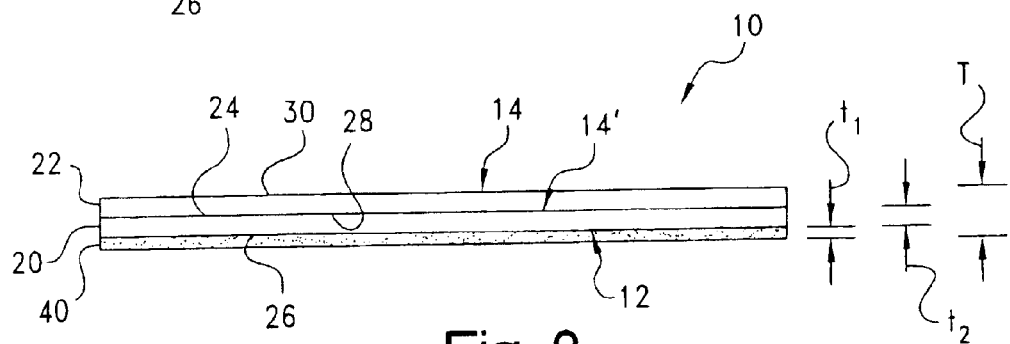
FIG. 2 is a cross-sectional view of the thermal interface pad of FIG. 1 taken through line 2—2 of FIG. 1.

Referring then to the figures wherein corresponding reference characters are used to designate corresponding elements throughout the several views with equivalent elements being referenced with prime or sequential alphanumeric designations, a representative thermally-conductive interface pad in accordance with the present invention is shown generally at 10 in perspective in FIG. 1 and in cross-section in FIG. 2. Within a thermal management assembly, pad 10 is interposable intermediate, for example, a pair of opposing heat transfer surfaces, such as from a heat sink or spreader and a heat-generating electronic component (see FIG. 4) to provide a low impedance, thermally-conductive pathway therebetween. In this regard, a first interface surface, referenced generally at 12, of pad 10 is disposable in conductive heat transfer contact or adjacency with one of the heat transfer surfaces, with an opposing second interface surface, referenced generally at 14 or, alternatively, at 14', of the pad 10 being disposable in conductive heat transfer contact or adjacency with the other of the heat transfer surfaces.

Pad 10, which may have an overall thickness, referenced at "T" in the cross-sectional view of FIG. 2, of between about 4 mils or less and about 40 mils (100–1000 µm), may be provided in the form of, or as formed from, a sheet, roll, tape, die-cut part, or the like. In basic construction, pad 10 is a formed of a first layer, 20, of a thermally-conductive compound formulated in accordance with the precepts of the present invention and, in the illustrated, "clean release" embodiment, a second layer, 22, of a thermally-conductive, flexible, lamellar graphite or tin foil material. It should be appreciated, however, that second layer 22 is optional, and that pad 10 therefore may consist essentially of the first layer 20 only, or as laminated with one or more layers other than, or in addition to, the second layer 22 as shown.

For most applications, first layer 20 will have thickness, referenced at "$t_1$" in FIG. 2, of between about 2–20 mils (50–500 µm), with the optional second layer 22 having a thickness, referenced at "$t_2$" in FIG. 2, of between about 1 mil or less and about 20 mils (25–500 nm). In such configuration, pad 10 generally will exhibit a thermal impedance, such as in accordance with ASTM D5470, of less than about 1° C.-in$^2$/W (6° C.-cm$^2$/W), and typically less than about 0.2° C.-in$^2$/W (1.2° C.-cm$^2$/W) and preferably not more than about 0.1° C.-in$^2$/W (0.6° C.-cm$^2$/W).

As is shown in the different views of FIGS. 1 and 2, first layer 20 in the illustrated clean release embodiment of pad 10 has a first interior surface, 24, and an opposing first exterior surface, 26, which defines the first interface surface 12. The optional second layer 22 has a second interior surface, 28, which adjoins the first interior surface 24 of the first layer 20, and an opposing second exterior surface, 30, which defines the second interface surface 14.

The first interior surface 24 of the first layer 20 may be coated on, bonded to, or otherwise joined and made integral with a sheet of the second layer 22 to provide the laminar structure of pad 10. The first exterior surface 26 of the first layer 20 is provided to be adherable or otherwise bondable to one of the heat transfer surfaces of the management assembly as will be detailed hereinafter in connection with FIGS. 3 and 4. In turn, the first exterior surface of the second layer 22 may be provided as a conformable yet cleanly releasable surface for contact with the other one of the heat transfer surfaces of the management assembly (FIG. 4). Alternatively, without the second layer 22, the first interior surface 24 of the first layer 20 thereby will define the second interface surface, now referenced at 14', of the pad 10 for contact with the other one of the heat transfer surfaces of the management assembly.

The lamellar, flexible graphite material of the second layer 22 may be provided as formed of intercalated graphite flake which is a rolled, calendered, molded, or otherwise compressed to form a sheet without the use of a binder. Such materials advantageously exhibit thermal stability, chemical resistance, low creep relaxation, and a relatively a high thermal conductivity in the "z" or "through sheet" direction of greater than about 7 W/m-K and a correspondingly low thermal impedance of between about 0.03–0.15° C.-in$^2$/W (0.18–0.9° C.-cm$^2$/W) at thicknesses of between about 5–20 mils (125–500 μm). Such materials, moreover, in being flexible, resilient, and compressible, are thereby able to conform to surface irregularities for lower thermal contact resistance and more efficient and faster heat transfer through the interface. Lamellar, flexible graphite sheet materials of the type herein involved are described further in U.S. Pat. No. 3,404,061, and are marketed commercially under the tradename "GRAFOIL®" by Graftech, Inc., Cleveland, Ohio. One suitable material is GRAFOIL® Grade T705 having a thickness about 5 mils (125 μm).

Alternatively, the thin, flexible tin material of the second layer 22 may be provided as formed of a tape, sheet or other layer of a relatively thin-gauge tin foil having, for example, a thickness of between about 1 mil or less and about 5 mils (25–125 μm) and, preferably, about 1 mil (25 μm) or less. Such materials typically will exhibit a thermal conductivity in the "z" or "through sheet" direction of about 60 w/m-K.

The thermally-conductive compound of the first layer 20 may be formulated in accordance with the precepts of the present invention as a blend or other admixture of a liquid resin constituent and one or more thermally-conductive, particulate fillers. The liquid resin constituent, which itself may be an admixture or blend, and which may be modified by blending with one or more other resins and/or one or more waxes, may be a copolymer of a monoolefin such as ethylene and a different monoolefin such as propylene (EPM), or a terpolymer of a monoolefin such as ethylene and a different monoolefin such as propylene, and a diene (EPDM) which may be ethylidene norbornene (ENB), dicyclopentadiene (DCPD), or a mixture thereof. The copolymer or terpolymer may have been about 5–15% by weight diene, and an ratio of ethylene to propylene (E/P) based on 100 parts by weight of between about 40–75 parts ethylene and 25–60 parts propylene. Such copolymers and terpolymers may be further described in U.S. Pat. No. 4,031,169.

The liquid EPM or EPDM constituent further may have a molecular weight of between about 5,000–10,000 by viscosity average ($M_v$) and/or between about 40,000–50,000 by weight average ($M_w$), and may be relatively viscous or viscoelastic at room temperature, i.e., about 25° C., as having a glass transition temperature ($T_g$) of between about 50–70° C., and a Brookfield (RVT #7) or other absolute viscosity at about such room temperature of at least about 1,000,000 cps (1,000 Pa-s), but substantially less viscous or viscoelastic at elevated temperatures so as to be highly conformable within the interface to afford PCM-like thermal performance. For example, the liquid EPM or EPDM may have a Brookfield (RVT #7) or other absolute viscosity of between about 10,000–100,000 cps (10–100 Pa-s) over a service temperature range of between about 125–175° C. An exemplary liquid EPDM (E/P 50/50, 10.5% DCPD, 35% total solids) is marketed under the tradename "TRILENE® 65" by Crompton Corporation-Uniroyal Chemical (Middlebury, Conn.). In this regard, as including the liquid EPM or EPDM constituent, the compound of layer 20 may be formulated to be substantially "form-stable" in exhibiting a gel or semi-solid like state at room temperature to be self-supporting or otherwise non-running, slumping, or sagging, such that it may be formed into sheets or pads or otherwise for application or handling, but also to be substantially conformable at an elevated temperature or temperature range in a liquid, semi-liquid, or otherwise viscous, generally-thixotropic, melt-flowable-like second state.

Preferably, the liquid EPM or EPDM constituent also is formulated to be inherently tacky, such as by control of solids content, surface energy, viscosity, or other physical or chemical property, to enable the layer 20 to be self-adherent at room temperature under a moderate applied pressure to the surface of the heat sink, spreader, or the like, and/or to the surface of the electronic component, without the necessity of heating or the provision of a separate pressure-sensitive adhesive (PSA) or other adhesive layer. In this regard the constituent may be inherently tacky, or it may be blended or otherwise admixed, to the extent that the thermal stability of the formulation is not overly compromised, with an adjuvant which may be a pressure sensitive adhesive (PSA) resin, a "low melt," i.e., having a melting temperature of between about 30–60° C., resin or wax, or a blend of such PSA resins or such low melt resins and waxes, or a blend of one or more of such PSA resins and one or more of such low melt resins or waxes. Such PSA resins include homopolymers, copolymers, terpolymers, interpenetrating networks, and blends of acrylic or (meth)acrylic acid, acrylates such as butyl acrylate or other alcohol ester, and/or amides such as acrylamide. The term "PSA" is used herein in its conventional sense to mean that the resin is formulated has having a glass transition temperature, surface energy, and other properties such that it exhibits some degree of tack at normal room temperature. "Low melt" resins include amorphous polymers of a $C_{10}$ or higher alkene, such as are marketed commercially by Petrolite Corporation, Tulsa, Okla., under the trade designation "VYBAR®."

Moreover, by varying the ratio of the liquid EPM or EPDM constituent to the PSA and/or low melt adjuvant, the formulation may be tailored to provide controlled viscometric for more optimum thermal performance with respect to such variables as the operating temperature of the heat generating electronic component, the magnitude of any applied external pressure, and the configuration of the interface. An exemplary weight ratio may be 2/3 parts of the liquid EPM or EPDM constituent to 1/3 parts of the PSA or low melt resin or wax adjuvant, provided, again, that the thermal stability of the formulation is not overly compromised.

The liquid resin constituent, as optionally admixed with the PSA and/or low melt constituents, generally forms a binder or other continuous phase within the compound into which the thermally-conductive particulate filler is dispersed. The filler is included within the binder in a proportion sufficient to provide the thermal conductivity desired for the intended application, and generally will be loaded at between about 20–80% by total weight of the compound. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01–10 mil (0.25–250 µm), but may further vary depending upon the thickness of layer 22. The filler preferably is selected as being electrically-nonconductive such that layer 20 may provide a dielectric or electrically-insulating, but thermally-conductive banner when interposed between an electronic component and a thermal dissipation member. Alternatively, the filler may be electrically-conductive in applications where electrical isolation is not required.

Suitable thermally-conductive fillers include boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of about 25–50 W/m-K. For reasons of economy, an aluminum oxide, i.e., alumina, may be used, while for reasons of improved thermal conductivity a boron nitride would be considered more preferred. Loaded with the thermally-conductive filler, the thermally-conductive compound of the first layer 20 typically will exhibit a thermal conductivity, per ASTM D5470, of at least about 0.5 W/m-K, and, as formed into the layer 20, a thermal impedance of less than about $0.2°$ C.-in$^2$/W ($1.2°$ C.-cm$^2$/W).

Additional fillers and additives may be included in the formulation depending upon the requirements of the particular application envisioned. Such fillers and additives may include conventional wetting agents or surfactants, opacifying or anti-foaming agents, chain extending oils, tackifiers, pigments, lubricants such as molybdenum disulfide ($MoS_2$), stabilizers, flame retardants such as decabromodiphenyl oxide, antioxidants, dispersants, flow modifiers, tackifiers, film-reinforcing polymers and other agents, and inert fillers such as fumed silica. The formulation may be compounded in a conventional mixing apparatus. Typically, these fillers and additives may be blended or otherwise admixed with the formulation, and may comprise between about 0.05–80% or more by total volume thereof.

In the production of commercial quantities of pad 10, the formulation of layer 20 may be compounded as an admixture of the liquid resin and other resin or wax constituents, the thermally-conductive fillers, and any other fillers or additives, under conditions of high shear in a roll mill or other mixer. After compounding, the admixture may be thinned with a solvent or other diluent. Thereafter, the formulation may be coated on the interior surface 28 of layer 22 in a conventional manner such as, for example, by a direct process such as spraying, knife coating, roller coating, casting, drum coating, dipping, dispensing, extrusion, screen printing, or like, or an indirect transfer process. After coating, the resultant material may be dried to flash the solvent or otherwise cured or cooled to develop an adherent film, coating, or other residue of the first layer 20 on the second layer 22. As a result of the inherent tack of the compound of layer 20 or the flow thereof, an adhesive and/or mechanical bond may be developed between the first and second layers 20 and 22 to form the integral, laminate structure of pad 10. Alternatively, the layer 20 may be separately formed and laminated under conditions of elevated temperature and/or pressure to the layer 22 in a separate operation.

Although not required, a carrier or reinforcement member (not shown in FIGS. 1 and 2) optionally may be incorporated within layer 20 as an interlayer therewithin or intermediate layers 20 and 22 to provide increased tear resistance. Conventionally, such member may be provided as a film formed of a thermoplastic material such as a polyimide or polyetheretherketone (PEEK), a layer of a woven or non-woven, e.g., needled, fiberglass fabric, cloth, web, or mat, or an aluminum or other metal foil, screen, or expanded mesh. Such reinforcement may improve the physical strength of the layer 20 and pad 10 to better facilitate handling at higher ambient temperatures and die cutting into a variety of geometries. The reinforcement member typically will have a thickness of between about 0.5–5 mil (12.5–125 µm), with a thickness of about 2 mil (50 µm) being preferred for metal foils.

To the extent that the compound of the first layer 20 is substantially non-tacky, i.e., having a dry or dead tack at room temperature, a separate PSA layer (not shown in FIGS. 1 and 2) may be provided on the exterior surface 26 thereof as a coating or the like having a thickness, for example, of between about 0.05–2 mil (1.25–50 µm). Depending upon the composition or surface energy of the heat transfer surface to which pad 10 is to be applied, such PSA layer may be formulated as a silicone or acrylic-based PSA resin optionally blended with a thermally-conductive filler. The term "PSA" is used herein in its conventional sense to mean that the material of the PSA layer is formulated has having a glass transition temperature, surface energy, and other properties such that it exhibits some degree of tack at normal room temperature. Generally, the PSA material will be selected to exhibit a lap or die shear adhesion, according to ASTM D1002 or Chomerics Test Procedure No. 54 (Parker Chomerics Division, Woburn, Mass.), respectively, of at least about 100 psi (0.7 MPa) to the substrate. Such adhesion may be developed from valence forces, mechanical interlocking action, or a combination thereof.

The acrylic-based PSA resin may be a homopolymer, copolymer, terpolymer, interpenetrating network, or blend of an acrylic or (meth)acrylic acid, an acrylate such as butyl acrylate or other alcohol ester, and/or an amide such as acrylamide. The silicone-based PSA resin may include a dry or wet film silicone resin or gum. Depending upon the formulation, the respective acrylic or silicone-based PSA constituents may form a binder into which the thermally-conductive filler is dispersed. The filler generally is loaded in the binder in a proportion sufficient to provide the thermal conductivity desired for the intended application, and may be of the type described hereinbefore in connection with layer 20.

With continuing reference to FIGS. 1 and 2, for ease of handling and as a protective layer for shipping, a release liner, 40, may be provided over the PSA layer or, and as is shown, in the case of an inherently tacky compound, over the exterior surface 26 of the first layer 20. Exemplary release liners include face stocks or other films of polyolefins, plasticized polyvinyl chloride, polyesters, cellulosics, metal foils, composites, and waxed, siliconized, or other coated paper or plastic having a relatively low surface energy to be removable without appreciable lifting of the first layer 20 from the second layer 22. Depending upon the intended application or otherwise for automated dispensing, individual pre-cut pads 10 may be provided in a roll form as carried on a tape of the liner 40. Alternatively, for automated application, a continuous tape of pad 10 may be supplied by adhering or otherwise laminating a tape of liner 40 to a length thereof.

Figure 3:
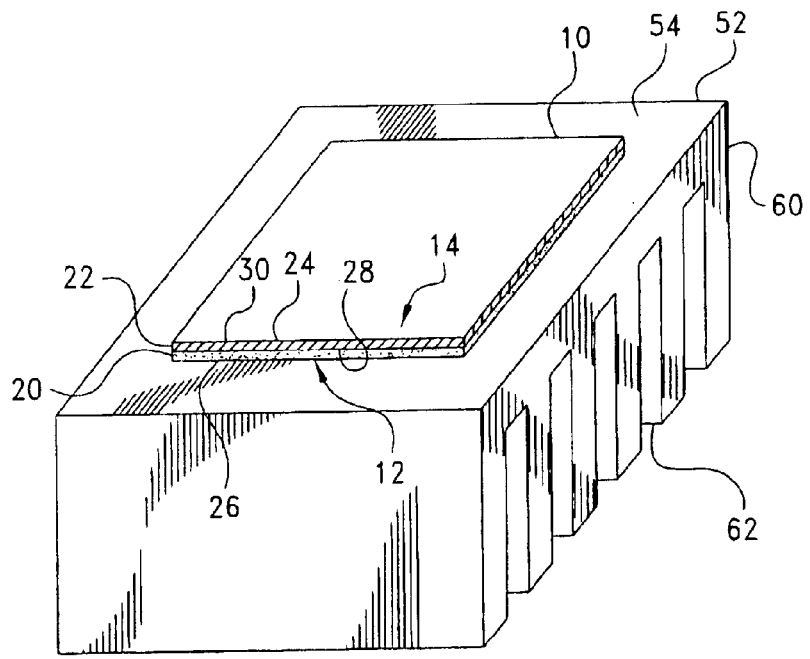
FIG. 3 is a perspective view showing the thermal interface of FIG. 1 as bonded to a plate-fin heat sink for use in a representative thermal management assembly.
Figure 4:
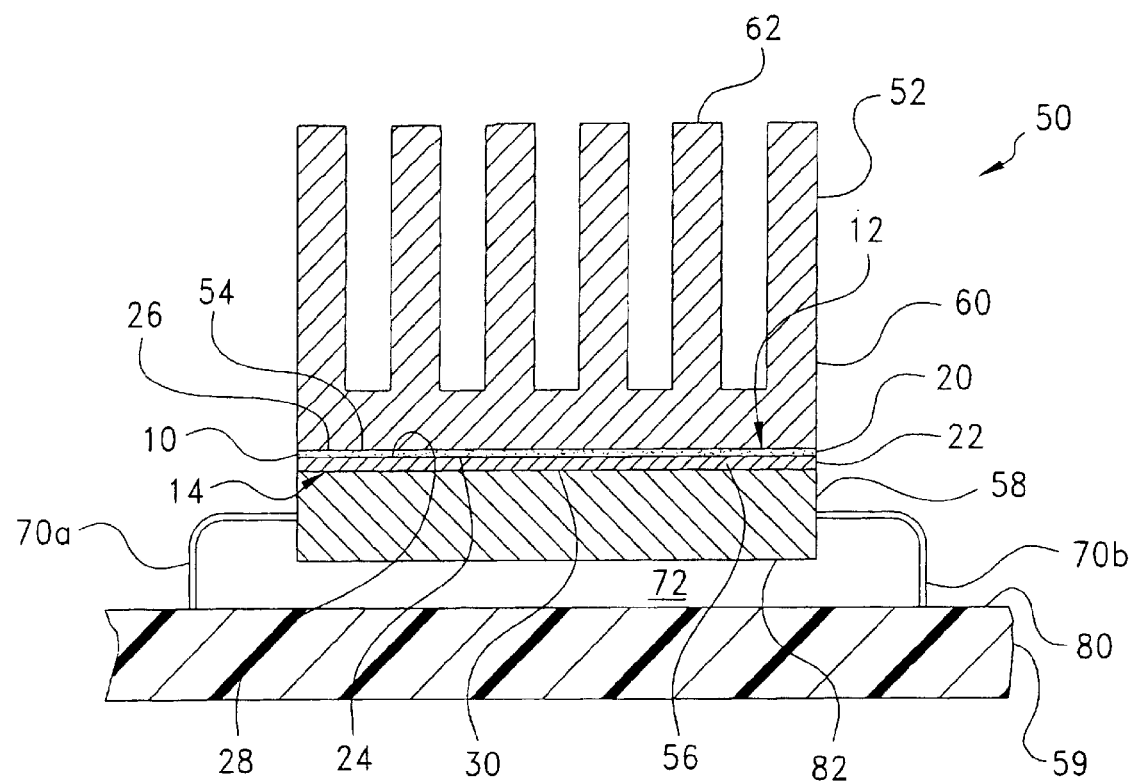
FIG. 4 is a cross-sectional view of a representative thermal management assembly wherein the heat sink and interface of FIG. 3 are disposed in heat transfer adjacency with a heat generating electronic component with the interface being interposed in conductive heat transfer contact with the heat sink and component to provide a low thermal impedance pathway therebetween; and The drawings will be described further in connection with the following Detailed Description of the Invention.

Turning next to FIGS. 3 and 4, the use of pad 10 of the invention is illustrated in connection with the thermal management assembly referenced generally at 50 in FIG. 4 which includes a thermal dissipation member, 52, having a heat transfer surface, 54, which is disposed in conductive heat transfer adjacency with an opposing heat transfer surface, 56, of a heat-generating analog, digital, or other electronic component, 58, supported on an associated printed circuit board (PCB) or other substrate, 59. For illustrative purposes, thermal dissipation member 52 is shown to be a heat sink which may be of a plate-fin variety having a generally planar base portion, 60, from which extends a plurality of cooling fins, one of which is referenced at 62. Alternatively, thermal dissipation member 52 may be provided as a pin fin or other heat sink, heat exchanger, cold plate, or heat spreader structure, or even a printed circuit board, housing, or chassis. Dissipation member 52 typically will be formed of a ceramic material such as alumina, or a metal material such as aluminum or copper having a heat capacity relative to that of component 58 to be effective is dissipating thermal energy conducted or otherwise transferred therefrom.

With reference to FIG. 4, electronic component 58 may be an integrated microchip, microprocessor, transistor, or other power semiconductor device, an ohmic or other heat-generating subassembly such as a diode, relay, resistor, transformer, amplifier, diac, or capacitor, or, alternatively, another heat-generating source. Typically, component 58 will have an operating temperature range of from about 60–100° C. For the electrical connection of component 58 to board 59, one or more pair of solder balls, leads, or pins, one pair of which is referenced at 70a–b, are provided as extending from component 58 into a soldered or other connection with board 59. Leads 70 additionally may support component 58 above board 59 to define a gap, represented at 72, of about 3 mils (75 microns) therebetween. Alternatively, component 58 may be received directly on board 59.

Returning to FIG. 3, with liner 40 (FIGS. 1 and 2) removed to expose, in the case of an inherently tacky compound, the exterior surface 26 of first layer 20, pad 10 may be adhered at room temperature and under a moderate applied pressure of between about 5–50 psi (35–350 kPa), or otherwise bonded or attached to the heat transfer surface 54 of the dissipation member 52. In this regard, and as aforementioned, pad 10 may be die cut or otherwise cut to size from a larger sheet or from a roll or other length of tape stock.

With the applied pad 10, dissipation member 52 may be packaged and shipped as an integrated unit to an electronics manufacturer, assembler, or other user. The user then simply may position the exposed exterior surface 26 of first layer 20 on the heat transfer surface 56 of electronic component 58, and lastly apply a clip, clamp, screw, or other another means of external pressure (not shown) to dispose the dissipation member 52 in thermal adjacency with the component 58 as is shown in FIG. 4.

With continuing reference to FIG. 4, within assembly 50, pad 10 provides a low impedance conductive pathway for the transfer of heat from component 58 to dissipation member 52. Such pathway may be employed without or in conjunction with convective air circulation for effecting the cooling of component 58 and ensuring that the operating temperature thereof is maintained below specified limits. Although thermal dissipation member 52 is shown to be a separate heat sink member, board 59 itself may be used for such purpose by alternatively interposing pad 10 within the gap 72 between board surface 80 thereof and the opposing surface 82 of electronic component 58.

As mentioned, the thermally-conductive compound of first layer 20 is formulated to be form-stable at normal room temperature, i.e., about 25° C., in a first state, which may be semi-solid or otherwise gel-like, but to be substantially conformable in service in a second state, which may be liquid, semi-liquid, or otherwise viscous or generally-thixotropic, to the heat transfer surface 54 of dissipation member 52. However, as the lamellar graphite or the tin foil material of the second layer 20 is substantially unaffected by the heating of the pad 10, the exterior surface 30 of the second layer 22 advantageously may be released cleanly, i.e., without substantial residue, from the heat transfer surface 56 of the component 58 for rework or other disassembly of the assembly 50.

It has been observed that, as formulated as described, the compound of layer 20 as including a liquid EPM or EPDM, or other liquid resin constituent in accordance with the present invention, exhibits little or substantially no appreciable weight loss even at temperatures of about 125° C. and even as high as about 165° C. For example, a formulation of liquid EPDM (TRILENE® 65) loaded at 30% by total weight of a boron nitride powder (AC-6004, -325 mesh, Advanced Ceramics, Cleveland, Ohio) exhibited a weight loss of only about 0.53% by weight after exposure to a temperature of 165° C. for 17 hours. Such formulation also was observed to have a thermal impedance (70° C., 100 psi (690 MPa)) of about 0.045° C.-in$^2$/W (0.27° C.-cm$^2$/W) in a free film form at a thickness of about 3–5 mils (76–127 $\mu$m), and of about 0.045° C.-in$^2$/W (0.27° C.-cm$^2$/W) as laminated with a 1.0 mil (25 $\mu$m) thick sheet of a soft tin foil.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A thermally-conductive interface interposable intermediate a first heat transfer surface and an opposing second heat transfer surface to provide a thermal pathway therebetween, the interface comprising a thermally-conductive compound formed into a first layer which is conformable between the first and second heat transfer surface, the compound comprising an admixture of:

(a) a liquid resin constituent comprising one or more monoolefin copolymers, one or more monoolefin terpolymers, or a blend of one or more monoolefin copolymers and one or more monoolefin terpolymers, the resin constituent being liquid at about room temperature; and (b) a particulate filler constituent, wherein the compound has an absolute viscosity of at least about 1,000,000 cps (1.000 Pa-s) at about room temperature, and of between about 10,000–100,000 cps (10–100 Pa-s) over a temperature ranee of between about 125–175° C.

2. The interface of claim 1 wherein one of the first or second heat transfer surfaces is located on a heat-generating source having an operating temperature range above normal room temperature.

3. The interface of claim 2 wherein the first layer is form-stable at about normal room temperature and is conformable within the operating temperature the heat-generating source between the first and second heat transfer surface.

4. The interface of claim 3 wherein the operating temperature of the heat-generating source is between about 125–165° C.

5. The interface of claim 3 wherein:
the heat-generating source is an electronic component; and
the other one of the first or second heat transfer surface is located on a thermal dissipation member.

6. The interface of claim 5 wherein the thermal dissipation member is a heat sink or a circuit board.

7. The interface of claim 1 wherein the liquid resin constituent comprises a copolymer or terpolymer of a first monoolefin and a second monoolefin different from the first monoolefin.

8. The interface of claim 7 wherein the first monoolefin is ethylene and the second monoolefin is a propylene.

9. The interface of claim 1 wherein the liquid polymeric component comprises a terpolymer of a first monoolefin, a second monoolefin different from the first monoolefin, and a diene.

10. The interface of claim 9 wherein the first monoolefin is ethylene and the second monoolefin is propylene.

11. The interface of claim 10 wherein the diene is selected from the group consisting of ethylidene norbornene, dicyclopentadiene, and mixtures thereof.

12. The interface of claim 1 wherein the particulate filler constituent is selected from the group consisting of boron nitride, titanium diboride, aluminum nitride, silicon carbide, graphite, metals, metal oxides, and mixtures thereof.

13. The interface of claim 12 wherein the compound comprises between about 20–80% by weight of the filler constituent.

14. The interface of claim 1 wherein the filler constituent has a thermal conductivity of at least about 20 W/m-K.

15. The interface of claim 1 the compound has a thermal conductivity of at least about 0.5 W/m-K.

16. The interface of claim 1 wherein the first layer has a thickness of between about 2–20 mils (50–500 $\mu$m).

17. The interface of claim 16 wherein the first layer has a thermal impedance of less than about 0.2° C.-in$^2$/W (1.2° C.-cm$^2$/W).

18. The interface of claim 1 wherein the compound is inherently tacky such that first layer is substantially self-adherent to one or both of the first and the second heat transfer surface.

19. The interface of claim 1 wherein the compound further comprises one or more pressure sensitive adhesive (PSA) resins, one or more low melt resins or waxes, or a blend thereof.

20. The interface of claim 19 wherein the compound is inherently tacky such that first layer is self-adherent to one or both of the first and the second heat transfer surface.

21. The interface of claim 1 wherein the interface has a first interface surface disposable in heat transfer contact with the first heat transfer surface and an opposing second interface surface disposable in heat transfer contact with the second heat transfer surface, and wherein the first layer has a first interior surface and a first exterior surface which defines the first interface surface, the interface further comprising:
a second layer formed of a flexible tin foil or lamellar graphite material, the second layer having a second interior surface adjoining the first interior surface of the first layer, and a second exterior surface which defines the second interface surface.

22. The interface of claim 21 wherein:
the first heat transfer surface is located on a thermal dissipation member; and
the second heat transfer surface is located on an electronic component.

23. The interface of claim 22 wherein the second interface surface is substantially cleanly releasable from heat transfer contact with the second heat transfer surface.

24. The interface of claim 21 wherein the first layer has a thickness of between about 2–20 mils (50–500 $\mu$m), and the second layer has a thickness of between about 1 mil (25 $\mu$m) or less and about 20 mils (500 $\mu$m).

25. The interface of claim 24 wherein the interface has a thermal impedance of less than about 1° C.-in$^2$/W (6° C.-cm$^2$/W).

26. The interface of claim 21 wherein the graphite material comprises intercalated graphite flake which is formed into a sheet.

27. A thermal management assembly comprising:
a first heat transfer surface;
a second heat transfer surface opposing said first heat transfer surface; and
a thermally-conductive interface interposed intermediate said first and said second heat transfer surface to provide a thermally-conductive pathway therebetween, the interface comprising a thermally-conductive compound formed into a first layer which is conformable between the first and second heat transfer surface, the compound comprising an admixture of:
(a) a resin constituent comprising one or more monoolefin copolymers, one or more monoolefin terpolymers, or a blend of one or more monoolefin copolymers and one or more monoolefin terpolymers, the resin constituent being liquid at about room temperature; and
(b) a particulate filler constituent,
wherein the compound has an absolute viscosity of at least about 1,000,000 cps (1,000 Pa-s) at about room temperature, and of between about 10,000–100,000 cps (10–100 Pa-s) over a temperature range of between about 125–175° C.

28. The assembly of claim 27 wherein one of the first or second heat transfer surfaces is located on a heat-generating source having an operating temperature range above normal room temperature.

29. The assembly of claim 28 wherein the first layer is form-stable at about normal room temperature and is conformable within the operating temperature the heat-generating source between the first and second heat transfer surface.

30. The assembly of claim 29 wherein the operating temperature of the heat-generating source is between about 125–165° C.

31. The assembly of claim 29 wherein:
the heat-generating source is an electronic component; and
the other one of the first or second heat transfer surface is located on a thermal dissipation member.

32. The assembly of claim 31 wherein the thermal dissipation member is a heat sink or a circuit board.

33. The assembly of claim 27 wherein the liquid resin constituent comprises a copolymer or terpolymer of a first monoolefin and a second monoolefin different from the first monoolefin.

34. The assembly of claim 33 wherein the first monoolefin is ethylene and the second monoolefin is a propylene.

35. The assembly of claim 27 wherein the liquid polymeric component comprises a terpolymer of a first monoolefin, a second monoolefin different from the first monoolefin, and a diene.

36. The assembly of claim 35 wherein the first monoolefin is ethylene and the second monoolefin is propylene.

37. The assembly of claim 36 wherein the diene is selected from the group consisting of ethylidene norbornene, dicyclopentadiene, and mixtures thereof.

38. The assembly of claim 27 wherein the particulate filler constituent is selected from the group consisting of boron nitride, titanium diboride, aluminum nitride, silicon carbide, graphite, metals, metal oxides, and mixtures thereof.

39. The assembly of claim 38 wherein the compound comprises between about 20–80% by weight of the filler constituent.

40. The assembly of claim 27 wherein the filler constituent has a thermal conductivity of at least about 20 W/m-K.

41. The assembly of claim 27 the compound has a thermal conductivity of at least about 0.5 W/m-K.

42. The assembly of claim 27 wherein the first layer has a thickness of between about 2–20 mils (50–500 μm).

43. The assembly of claim 42 wherein the first layer has a thermal impedance of less than about 0.2° C.-in$^2$/W (1.2° C.-cm$^2$/W).

44. The assembly of claim 27 wherein the compound is inherently tacky such that first layer is substantially self-adherent to one or both of the first and the second heat transfer surface.

45. The assembly of claim 27 wherein the compound further comprises one or more pressure sensitive adhesive (PSA) resins, one or more low melt resins or waxes, or a blend thereof.

46. The assembly of claim 45 wherein the compound is inherently tacky such that first layer is self-adherent to one or both of the first and the second heat transfer surface.

47. The assembly of claim 27 wherein the interface has a first interface surface disposable in heat transfer contact with the first heat transfer surface and an opposing second interface surface disposable in heat transfer contact with the second heat transfer surface, and wherein the first layer has a first interior surface and a first exterior surface which defines the first interface surface, the interface further comprising:

a second layer formed of a flexible tin foil or lamellar graphite material, the second layer having a second interior surface adjoining the first interior surface of the first layer, and a second exterior surface which defines the second interface surface.

48. The assembly of claim 47 wherein:

the first heat transfer surface is located on a thermal dissipation member; and the second heat transfer surface is located on an electronic component.

49. The assembly of claim 48 wherein the second interface surface is substantially cleanly releasable from heat transfer contact with the second heat transfer surface.

50. The assembly of claim 47 wherein the first layer has a thickness of between about 2–20 mils (50–500μm), and the second layer has a thickness of between about 1 mil (25 μm) or less and about 20 mils (500 μm).

51. The assembly of claim 50 wherein the interface has a thermal impedance of less than about 1° C.-in$^2$/W (6° C.-cm$^2$/W).

52. The assembly of claim 47 wherein the graphite material comprises intercalated graphite flake which is formed into a sheet.

* * * * *